US012147031B2

(12) United States Patent
Ishida (10) Patent No.: US 12,147,031 B2
(45) Date of Patent: Nov. 19, 2024

(54) OPTICAL REFLECTIVE ELEMENT FOR CAUSING AN ILLUMINATION POSITION OF LIGHT TO RECIPROCATE

(71) Applicant: PANASONIC INTELLECTUAL PROPERTY MANAGEMENT CO., LTD., Osaka (JP)

(72) Inventor: Takami Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 836 days.

(21) Appl. No.: 17/181,590

(22) Filed: Feb. 22, 2021

(65) Prior Publication Data

US 2021/0173201 A1 Jun. 10, 2021

Related U.S. Application Data

(63) Continuation of application No. PCT/JP2019/032338, filed on Aug. 20, 2019.

(30) Foreign Application Priority Data

Aug. 31, 2018 (JP) .................. 2018-162854

(51) Int. Cl.
*G02B 26/10* (2006.01)
*G02B 26/08* (2006.01)

(52) U.S. Cl.
CPC ....... *G02B 26/105* (2013.01); *G02B 26/0858* (2013.01)

(58) Field of Classification Search
None
See application file for complete search history.

(56) References Cited

U.S. PATENT DOCUMENTS

2004/0075522 A1* 4/2004 Kato .................. H01F 7/1646
336/200
2010/0296147 A1 11/2010 Terada et al.
(Continued)

FOREIGN PATENT DOCUMENTS

JP 2009-186721 A 8/2009
JP 2009-244602 A 10/2009
(Continued)

OTHER PUBLICATIONS

International Search Report and Written Opinion issued on Oct. 29, 2019 in International Application No. PCT/JP2019/032338; with partial English translation.

*Primary Examiner* — Jennifer D. Carruth
(74) *Attorney, Agent, or Firm* — Rimon P.C.

(57) ABSTRACT

An optical reflective element includes: a reflective body that rotationally oscillates about a first rotational axis; a first connector body that is coupled to the reflective body, and includes a groove portion provided in a position in which the first rotational axis is located; a first vibration body that is disposed in a direction intersecting the first rotational axis, and is coupled to a proximal end portion of the first connector body; a second vibration body that is disposed on a side opposite the first vibration body; a first driving body that causes the first vibration body to rotate; a second driving body that is coupled to the second vibration body; and a second connector body that connects the first vibration body and the second vibration body in a manner that allows the first vibration body and the second vibration body to vibrate.

7 Claims, 9 Drawing Sheets

(56) References Cited

U.S. PATENT DOCUMENTS

| | | | |
|---|---|---|---|
| 2011/0102870 A1* | 5/2011 | Nakamura | G02B 26/085 |
| | | | 359/198.1 |
| 2012/0033279 A1 | 2/2012 | Furukawa et al. | |
| 2012/0162739 A1 | 6/2012 | Yamada | |
| 2014/0226194 A1 | 8/2014 | Mihara et al. | |
| 2015/0203346 A1* | 7/2015 | Fujimoto | B81B 3/0072 |
| | | | 74/1 SS |

FOREIGN PATENT DOCUMENTS

| | | |
|---|---|---|
| JP | 2009-258339 A | 11/2009 |
| JP | 2009-265560 A | 11/2009 |
| JP | 2011-095331 A | 5/2011 |
| JP | 2012-133242 A | 7/2012 |
| WO | 2010/131449 A1 | 11/2010 |
| WO | 2013/046612 A1 | 4/2013 |

* cited by examiner

OPTICAL REFLECTIVE ELEMENT FOR CAUSING AN ILLUMINATION POSITION OF LIGHT TO RECIPROCATE

CROSS REFERENCE TO RELATED APPLICATIONS

This application is a U.S. continuation application of PCT International Patent Application Number PCT/JP2019/032338 filed on Aug. 20, 2019, claiming the benefit of priority of Japanese Patent Application Number 2018-162854 filed on Aug. 31, 2018, the entire contents of which are hereby incorporated by reference.

BACKGROUND

1. Technical Field

The present disclosure relates to an optical reflective element that causes an illumination position of laser light etc. to reciprocate.

2. Description of the Related Art

Conventional optical reflective elements that cause an illumination position of laser light to reciprocate include, as exemplified in Japanese Unexamined Patent Application Publication No. 2009-244602, a reflective body that reflects laser light etc., a connector body that is connected with the reflective body and causes the reflective body to rotationally oscillate by the connector body being twisted, vibration bodies in the shape of two arms which extend in the direction intersecting the rotational axis of the reflective body for causing the connector body to generate reciprocal torsion, and driving bodies each including a piezoelectric element etc. for causing respective vibration bodies to vibrate.

SUMMARY

Such optical reflective elements are smaller and lighter than reflective elements in which a polygon mirror is caused to rotate by a motor, and also use less electric power to cause the reflective bodies to rotationally oscillate. However, when such an optical reflective element is attached to, for example, a car which produces strong vibrations, a disturbance vibration is transmitted to the reflective body and prevent the optical reflective element from driving stably.

In view of the above, the present disclosure aims to provide a highly durable optical reflective element that can be stably driven even when a disturbance vibration is produced.

In order to provide such an optical reflective element, an optical reflective element according to an aspect of the present disclosure includes: a reflective body that rotationally oscillates about a first rotational axis, and reflects light; a first connector body that is disposed along the first rotational axis, and includes a distal end portion coupled to the reflective body and a groove portion provided in a position in which the first rotational axis is located; a first vibration body that extends in a direction intersecting the first rotational axis, and is coupled to a proximal end portion of the first connector body; a second vibration body that extends in a direction intersecting the first rotational axis, and is coupled to the proximal end portion of the first connector body, the second vibration body being on a side opposite the first vibration body with respect to the first rotational axis; a first driving body that is coupled to a distal end portion of the first vibration body, and causes the first connector body to rotationally oscillate via the first vibration body; a second driving body that is coupled to a distal end portion of the second vibration body, and causes the first connector body to rotationally oscillate via the second vibration body; a first base; and a second connector body that connects the first vibration body and the second vibration body to the first base in a manner that allows the first vibration body and the second vibration body to vibrate.

According to the present disclosure, it is possible to provide a highly durable optical reflective element that can be stably driven even when a disturbance vibration is produced.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Next, embodiments of an optical reflective element according to the present disclosure will be described with reference to the drawings. Note that the embodiments below each describe a general or specific example. The numerical values, shapes, materials, structural elements, the arrangement and connection of the structural elements, steps, and processing orders of the steps, etc. presented in the embodiments below are mere examples and do not limit the present disclosure. Furthermore, among the structural elements in the embodiments below, those not recited in any one of the independent claims representing the most generic concepts will be described as optional structural elements.

In addition, the drawings are schematically illustrated. The structural elements in these schematic diagrams are optionally emphasized, omitted, and proportionally adjusted to describe the present disclosure. For this reason, the structural elements may have shapes, positional relations, and proportions which are different from the actual shapes, positional relations, and proportions.

Embodiment 1

Figure 1:
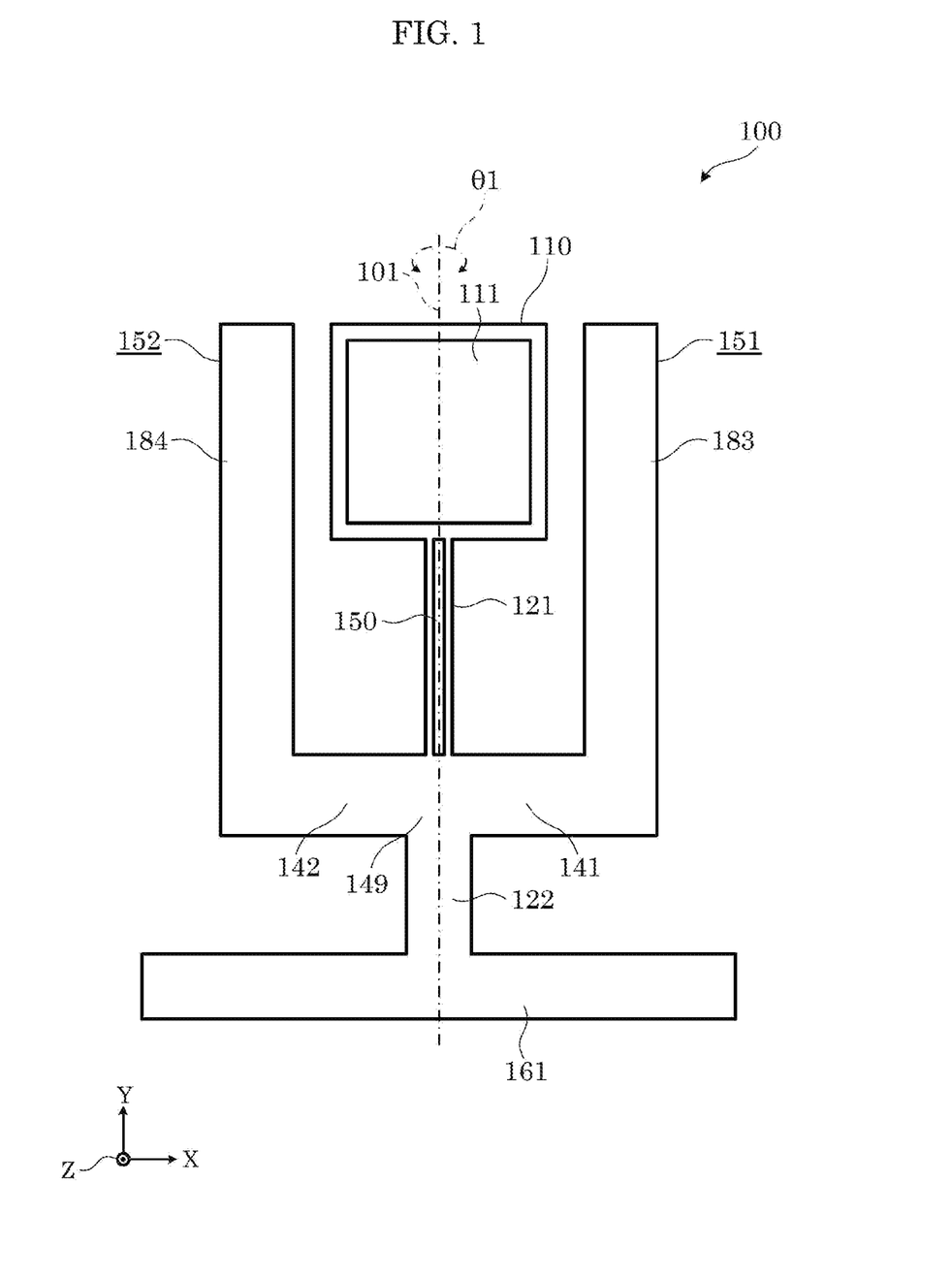
FIG. 1 is a plan view illustrating an optical reflective element according to Embodiment 1.
Figure 2:
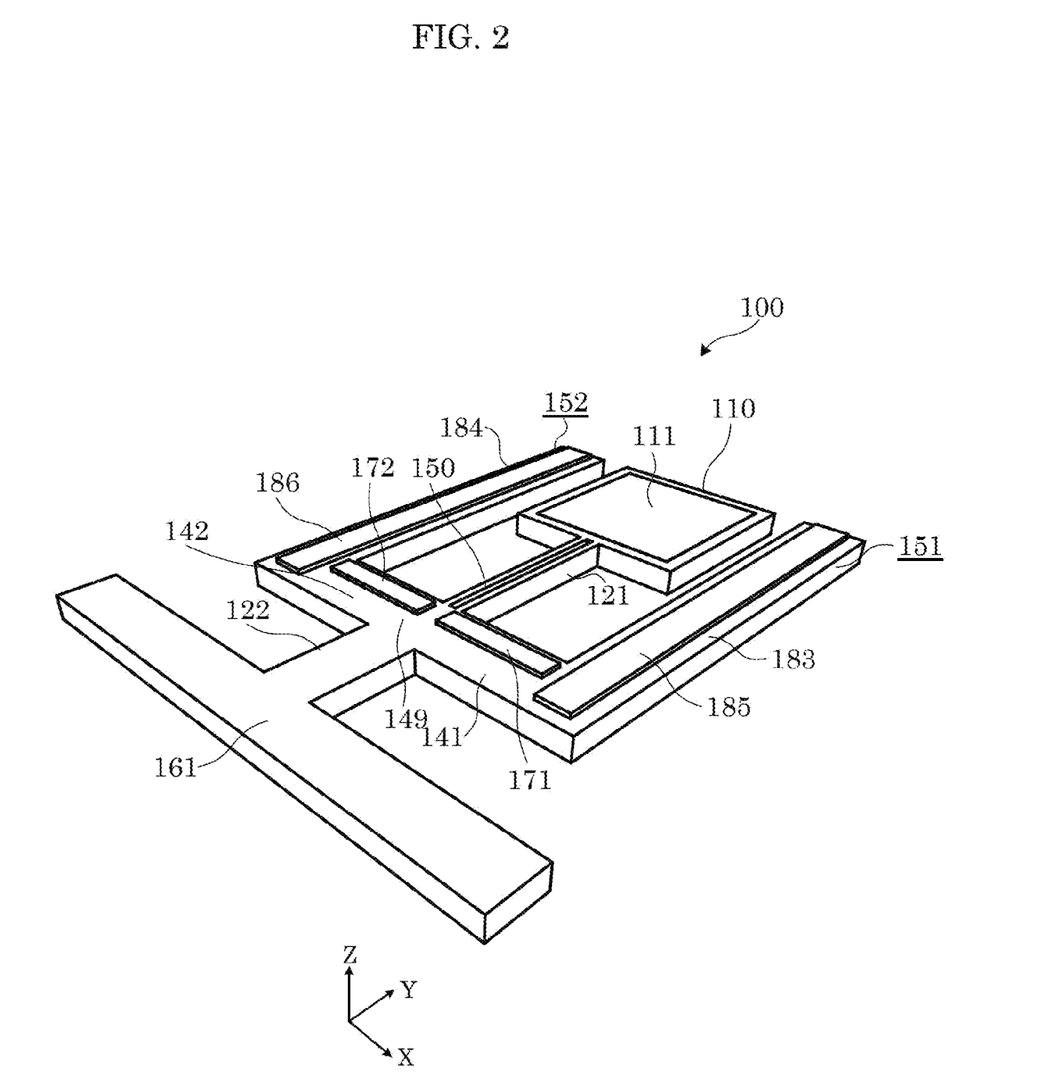
FIG. 2 is a perspective view illustrating the optical reflective element according to Embodiment 1.

FIG. 1 is a plan view illustrating an optical reflective element according to Embodiment 1. FIG. 2 is a perspective view illustrating the optical reflective element according to Embodiment 1.

Optical reflective element 100 is a device that periodically changes the angle of reflection of light, such as laser light, and periodically sweeps an illumination position of the light. As illustrated in FIG. 1 and FIG. 2, optical reflective element 100 includes: reflective body 110; first connector body 121 and second connector body 122 which are connector bodies; first vibration body 141 and second vibration body 142 which are vibration bodies; first driving body 151 and second driving body 152 which are driving bodies; and first base 161 which is a base. In addition, in this embodiment, part of reflective body 110, the connector bodies, part of the vibration bodies, and the base are integrally formed by removing unnecessary portions from one base material. Specifically, the unnecessary portions are removed from a silicon substrate using an etching technique employed in a semiconductor manufacturing process to integrally form part of reflective body 110, the connector bodies, part of the vibration bodies, and the base. Optical reflective element 100 is the so-called micro electro mechanical systems (MEMS). Moreover, optical reflective element 100 includes first monitor element 171 and second monitor element 172 which are monitor elements.

Here, although a material that the base material includes is not particularly limited, it is desirable that the material has mechanical strength and a high Young's modulus, such as metals, crystals, glass, and resins. Specifically, the material may be metals and alloys, such as silicon, titanium, stainless steel, elinvar, and a brass alloy. The use of such metals and alloys makes it possible to realize optical reflective element 100 having an excellent vibration characteristic and excellent processability.

Reflective body 110 is a part that rotationally oscillates (repetitive rotational vibration) about first rotational axis 101, and reflects light. Although the shape of reflective body 110 is not particularly limited, reflective body 110 in this embodiment is in the shape of a quadrilateral plate. Reflective body 110 is provided with reflector 111 on its surface which can reflect light to be reflected with high reflectance. The material used for reflector 111 can be optionally selected. For example, the material may be metals or metallic compounds, such as gold, silver, copper, and aluminum. In addition, reflector 111 may consist of two or more layers. Furthermore, reflector 111 may be provided by smoothly polishing a surface of reflective body 110. Reflector 111 may have a curved surface, instead of a plane surface.

First connector body 121 is a member that is disposed along first rotational axis 101. First connector body 121 holds reflective body 110 in a state in which a distal end portion of first connector body 121 and reflective body 110 are coupled together and a proximal end portion of first connector body 121 and each of a proximal end portion of first vibration body 141 and a proximal end portion of second vibration body 142 are coupled together. First connector body 121 is a member that transmits, to reflective body 110, torque for causing reflective body 110 to rotationally oscillate. First connector body 121 is capable of causing reflective body 110 to rotationally oscillate by first connector body 121 being twisted about first rotational axis 101 (see θ1 in the diagram) while holding reflective body 110. First connector body 121 includes groove portion 150 in a position in which first rotational axis 101 is located.

Although the shape of first connector body 121 is not particularly limited, first connector body 121 is in the shape of a slim bar having, as a whole, a width (a length in the X-axis direction in the diagram) narrower than the width of reflective body 110 since first connector body 121 is a member that causes reflective body 110 to rotationally oscillate by first connector body 121 being twisted. In this embodiment, groove portion 150 that is provided in first connector body 121 is in the shape of a slit that penetrates first connector body 121 in the direction (the Z-axis direction in the diagram) orthogonal to a reflective surface of reflective body 110. In addition, groove portion 150 extends from the distal end portion of first connector body 121 which is connected to reflective body 110 to the proximal end portion of first connector body 121 which is connected to coupling body 149. Accordingly, first connector body 121 can be seen as two bar-shaped members with first rotational axis 101 interposed therebetween. Cross sections of first connector body 121 perpendicular to first rotational axis 101 each are in the shape of a quadrilateral. The thickness of first connector body 121 is the same as the thickness of reflective body 110 and the other members. The cross sections of first connector body 121 have the same shape from reflective body 110 to the proximal end portion of first vibration body 141 and the proximal end portion of second vibration body 142. The cross sections of first connector body 121 orthogonal to first rotational axis 101 having the uniform quadrilateral shape and uniform area along first rotational axis 101, and first connector body 121 being rotationally symmetric with respect to first rotational axis 101 enable the entirety of first connector body 121 to uniformly twist, thereby preventing damage due to a stress concentration in the longitudinal direction of first connector body 121.

In addition, the inventor has found out that stress concentrates on an area in which first rotational axis 101 is located in the case in which groove portion 150 is not provided in first connector body 121. Accordingly, in this embodiment, groove portion 150 is provided to make a gap in an area in which first rotational axis 101 is located to enable the stress to be distributed to each of separated portions of first connector body 121. This prevents damage due to a stress concentration in the widthwise direction of first connector body 121.

It should be noted that these structural members need not have the same thickness. For example, if reflective body 110 is thicker than first connector body 121 and a transmission body, it is suitable to prevent surface distortion of reflective body 110. In addition, if the thickness of first base 161 increases, it is suitable to secure a space in the Z-axis direction which is necessary for driving first driving body 151, second driving body 152, and reflective body 110 in the case in which optical reflective element 100 is attached to a flat surface of a product, for example. The increase in the thickness of first base 161 also increases the structural strength of the entirety of optical reflective element 100.

It should be noted that the description of first connector body 121 being disposed along first rotational axis 101 includes not only the case in which first connector body 121 is disposed directly along first rotational axis 101, but also the case in which first connector body 121 is disposed along the entirety of first rotational axis 101 that is imaginarily straight, even if first connector body 121 windingly bends or zigzags.

In addition, the term "intersection" used in this embodiment and the claims includes not only an intersection in which two lines are in contact with each other, but also an overpass crossing or an underpass crossing in which two lines do not contact with each other.

The vibration bodies including first vibration body 141 and second vibration body 142 each are a member in the shape of an arm. The vibration bodies vibrate in the circumferential direction about first rotational axis 101 to produce torque for causing reflective body 110 to rotationally oscillate. The vibration bodies each extend in a direction intersecting first rotational axis 101. First vibration body 141 is disposed in a direction intersecting first rotational axis 101, and is coupled to the proximal end portion of first connector body 121. Second vibration body 142 is disposed in a direction intersecting first rotational axis 101 on the side opposite first vibration body 141 with respect to first rotational axis 101, and is coupled to the proximal end portion of first connector body 121.

In this embodiment, first vibration body 141 is a member in the shape of a quadrilateral bar that extends in a direction orthogonal to first rotational axis 101, and second vibration body 142 is a member in the shape of a quadrilateral bar that extends in a direction orthogonal to first rotational axis 101 and in a direction opposite to first vibration body 141.

In addition, the proximal end portion of first vibration body 141 and the proximal end portion of second vibration body 142 are integrally coupled together with coupling body 149. First vibration body 141 and second vibration body 142 are in the shape of a straight bar, and each extend from first rotational axis 101 as their center and in a direction orthogonal to first rotational axis 101.

The driving bodies including first driving body 151 and second driving body 152 are members that produce a driving force for causing distal end portions of the vibration bodies to vibrate in the circumferential direction about first rotational axis 101. First driving body 151 is coupled to the distal end portion of first vibration body 141. First driving body 151 is a member that causes first vibration body 141 to vibrate about first rotational axis 101 to cause first connector body 121 to rotationally oscillate. Second driving body 152 is coupled to the distal end portion of second vibration body 142. Second driving body 152 is a member that causes second vibration body 142 to vibrate about first rotational axis 101 to cause first connector body 121 to rotationally oscillate.

In this embodiment, first driving body 151 has a proximal end portion that is integrally coupled to the distal end portion of first vibration body 141. First driving body 151 includes first driving body main portion 183 having a cross section in the shape of a quadrilateral bar that is disposed along first rotational axis 101 and extends toward reflective body 110. First driving body main portion 183 includes, on its surface, first piezoelectric element 185 that is a piezoelectric element in the shape of a narrow plate disposed along first rotational axis 101. The application of a periodically varying voltage to first piezoelectric element 185 causes first piezoelectric element 185 to repeatedly expand and contract. First driving body main portion 183 repeatedly bends and straightens out in accordance with the motion of first piezoelectric element 185. A distal end portion of first driving body main portion 183 which extends over the proximal end portion of first driving body 151 which is coupled to first vibration body 141 vibrates greatly, and the vibrational energy of the entire first driving body 151 is transmitted to the distal end portion of first vibration body 141.

Like first driving body 151, second driving body 152 also includes second driving body main portion 184 and second piezoelectric element 186. Second driving body 152 and first driving body 151 are symmetrically disposed with respect to an imaginary plane in which first rotational axis 101 is located and which is orthogonal to the surface of reflective body 110. Second driving body 152 has a proximal end portion that is coupled to the distal end portion of second vibration body 142. In addition, second driving body 152 operates in the same manner as first driving body 151.

In this embodiment, the piezoelectric elements are thin-film stacking-type piezoelectric actuators each having a stacked body structure in which an electrode and a piezoelectric body are stacked in the thickness direction. The piezoelectric elements are formed on the respective surfaces of the driving body main portions. With this, it is possible to make the driving bodies thinner.

It should be noted that the driving bodies each may include a member, a device, etc. which generate power using not only the distortion of a piezoelectric element, but also an interaction with a magnetic field and an electric field. The driving bodies each may vibrate by changing at least one of a magnetic field and an electric field which are produced by an external device, or by changing at least one of a self-produced magnetic field and a self-produced electric field. In addition, the piezoelectric bodies may include, for example, a piezoelectric material having a high piezoelectric constant, such as titanic acid lead zirconate (PZT).

First base 161 is a member for attaching optical reflective element 100 to an external structural member etc. First base 161 is coupled to second connector body 122 that connects first vibration body 141 and second vibration body 142 to first base 161 in a manner that allows first vibration body 141 and second vibration body 142 to vibrate.

Second connector body 122 is disposed along first rotational axis 101. Second connector body 122 has a proximal end portion coupled to first base 161, and a distal end portion coupled to the proximal end portion of first vibration body 141 and the proximal end portion of second vibration body 142.

Although the shape of second connector body 122 is not particularly limited, second connector body 122 is in the shape of a bar and has torsional rigidity greater than the torsional rigidity of first connector body 121 since second connector body 122 is a member that tolerates the torsion of first connector body 121 for first base 161 by second connector body 122 being twisted by vibrations transmitted from first vibration body 141 and second vibration body 142. In this embodiment, cross sections of second connector body 122 perpendicular to first rotational axis 101 each are in the shape of a quadrilateral. The thickness of second connector body 122 is the same as the thickness of first connector body 121 and the other members. Accordingly, second connector body 122 has the width (the length in the X-axis direction in the diagram) greater than the width of first connector body 121. In addition, the cross sections of second connector body 122 have the same shape from first base 161 to the vibration bodies. This prevents a stress concentration in the same manner as first connector body 121, thereby preventing second connector body 122 from being fractured.

In this embodiment, the entirety of first connector body 121 and second connector body 122 is weak in torsional rigidity since the torsional rigidity of first connector body 121 and second connector body 122 is uniform along first rotational axis 101. Accordingly, the torsional rigidity per unit length of first connector body 121 is weaker than that of second connector body 122. It should be noted that if first connector body 121 has a portion that is weaker in torsional rigidity than the torsional rigidity of the remaining portion, and if second connector body 122 has a portion weaker in torsional rigidity than the torsional rigidity of the remaining portion, it is desirable that the torsional rigidity of first connector body 121 is weaker than that of second connector body 122 when those portions having the weakest torsional rigidity are compared.

Like first connector body 121, second connector body 122 may be disposed, not only directly along first rotational axis 101, but also windingly bended or zigzagged along first rotational axis 101. Even in such a case, first connector body 121 has weaker torsional rigidity than the torsional rigidity of second connector body 122 when the torsional rigidity about first rotational axis 101 is compared between first connector body 121 and second connector body 122.

In this embodiment, first monitor element 171 and second monitor element 172, which are the monitor elements, are attached to first vibration body 141 and second vibration body 142, respectively. The monitor elements detect, as distortion, the bending states of these vibration bodies. The rotational oscillation state of reflective body 110 can be accurately monitored by measuring outputs from the monitor elements.

In this embodiment, first monitor element 171 and second monitor element 172 are attached to first vibration body 141 and second vibration body 142, respectively. Each of these first monitor element 171 and second monitor element 172 is connected to a detection circuit which is not illustrated, and a difference in outputs from the two monitor elements is detected. This cancels various noises, and thus the rotational oscillation state of reflective body 110 can be accurately monitored. Accordingly, it is possible to feed back this accurately monitored rotational oscillation state of reflective body 110 for the control of the driving bodies.

In optical reflective element 100 described in the above Embodiment 1, driving of first driving body 151 and second driving body 152 in antiphase causes first vibration body 141 and second vibration body 142 to vibrate in antiphase, thereby producing torque having the same rotational direction about first rotational axis 101. The transmission of this torque to the proximal end portion of first connector body 121 enables efficient torque transmission. In addition, even if a disturbance vibration is transmitted to optical reflective element 100 via first base 161, second connector body 122 prevents the transmission of the disturbance vibration to first connector body 121. This enables reflective body 110 to stably rotationally oscillate.

Furthermore, efficient transmission of vibration (torque) that is produced by first vibration body 141 and second vibration body 142 to first connector body 121 enhances a degree of the resonance sharpness (Q factor) of a structural body including reflective body 110 and first connector body 121. In other words, the degree of the resonance sharpness (Q factor) of the structural body including reflective body 110 and first connector body 121 enhances due to the reduction in transmission loss of the vibration (torque) transmitted to first connector body 121. The driving frequency band of reflective body 110 narrows as a degree of resonance sharpness (Q factor) enhances. Accordingly, optical reflective element 100 is less likely to be affected by a disturbance vibration, and thus reflective body 110 is allowed to stably rotationally oscillate.

In addition, groove portion 150 provided in first connector body 121 is capable of (i) distributing the stress concentrated about first rotational axis 101, (ii) enhancing the mechanical strength of first connector body 121, (iii) increasing the movable range (oscillation angle denoted by θ) of optical reflective element 100, and (iv) enhancing the durability of optical reflective element 100.

It should be noted that the present disclosure is not limited to the above-described embodiment. For example, different embodiments realized by combining optional structural elements described in the present specification or by excluding some of the structural elements described in the present specification may be embodiments of the present disclosure. The present disclosure also includes variations achieved by applying various modifications conceivable to those skilled in the art to each of the embodiments etc., without departing from the essence of the present disclosure, or in other words, without departing from the meaning of wording recited in the claims.

Figure 3:
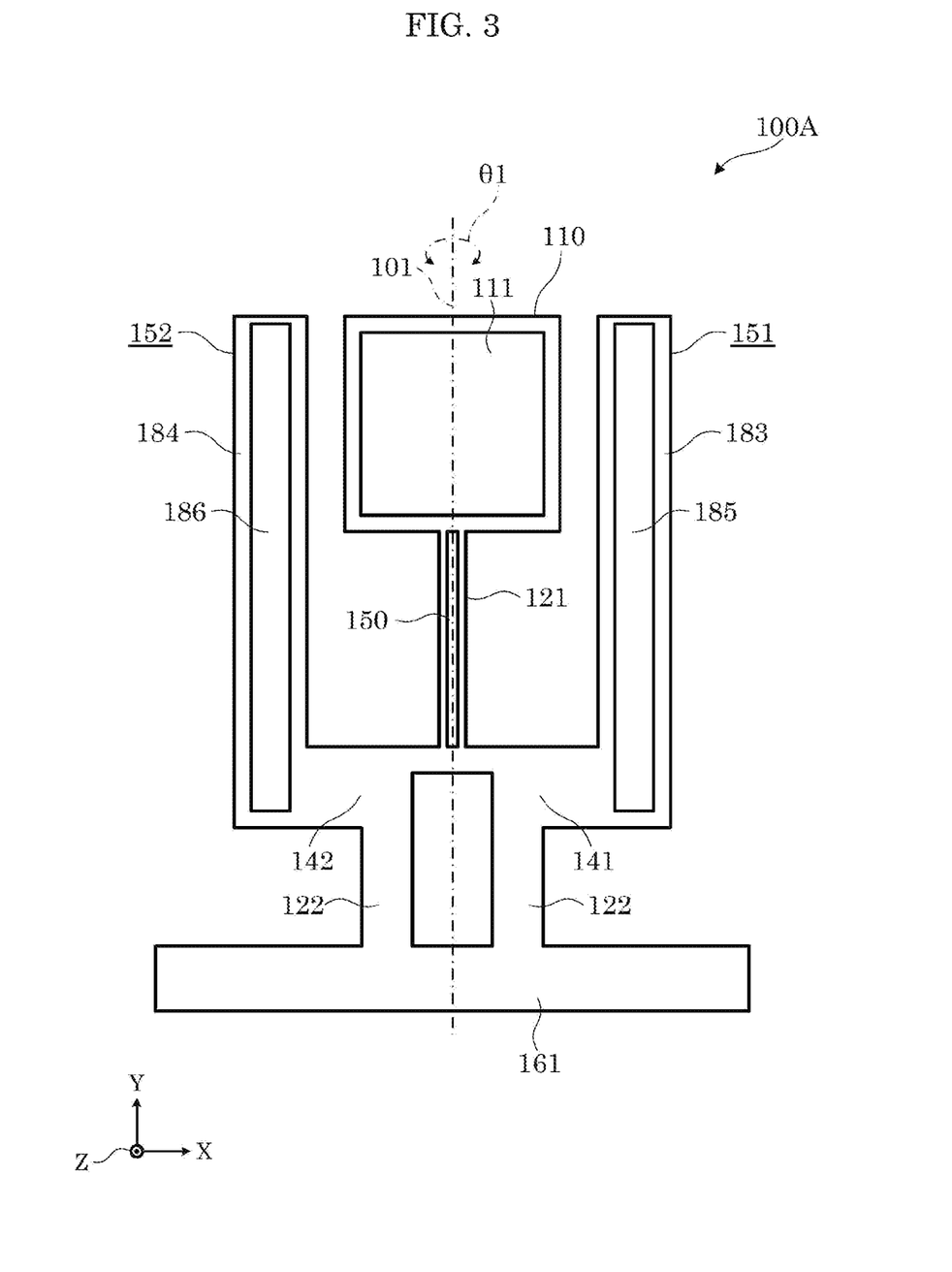
FIG. 3 is a plan view illustrating an optical reflective element according to Variation 1.

For example, as illustrated in FIG. 3, second connector body 122 may be divided into parts so as to be coupled to each of the proximal end portion of first vibration body 141 and the proximal end portion of second vibration body 142. In this case, the torsional rigidity of second connector body 122 about first rotational axis 101 means the rigidity obtained by twisting the entire second connector body 122. Accordingly, the torsional rigidity can be enhanced structurally by placing several parts of second connector body 122 further apart from one another with first rotational axis 101 interposed therebetween.

Figure 4:
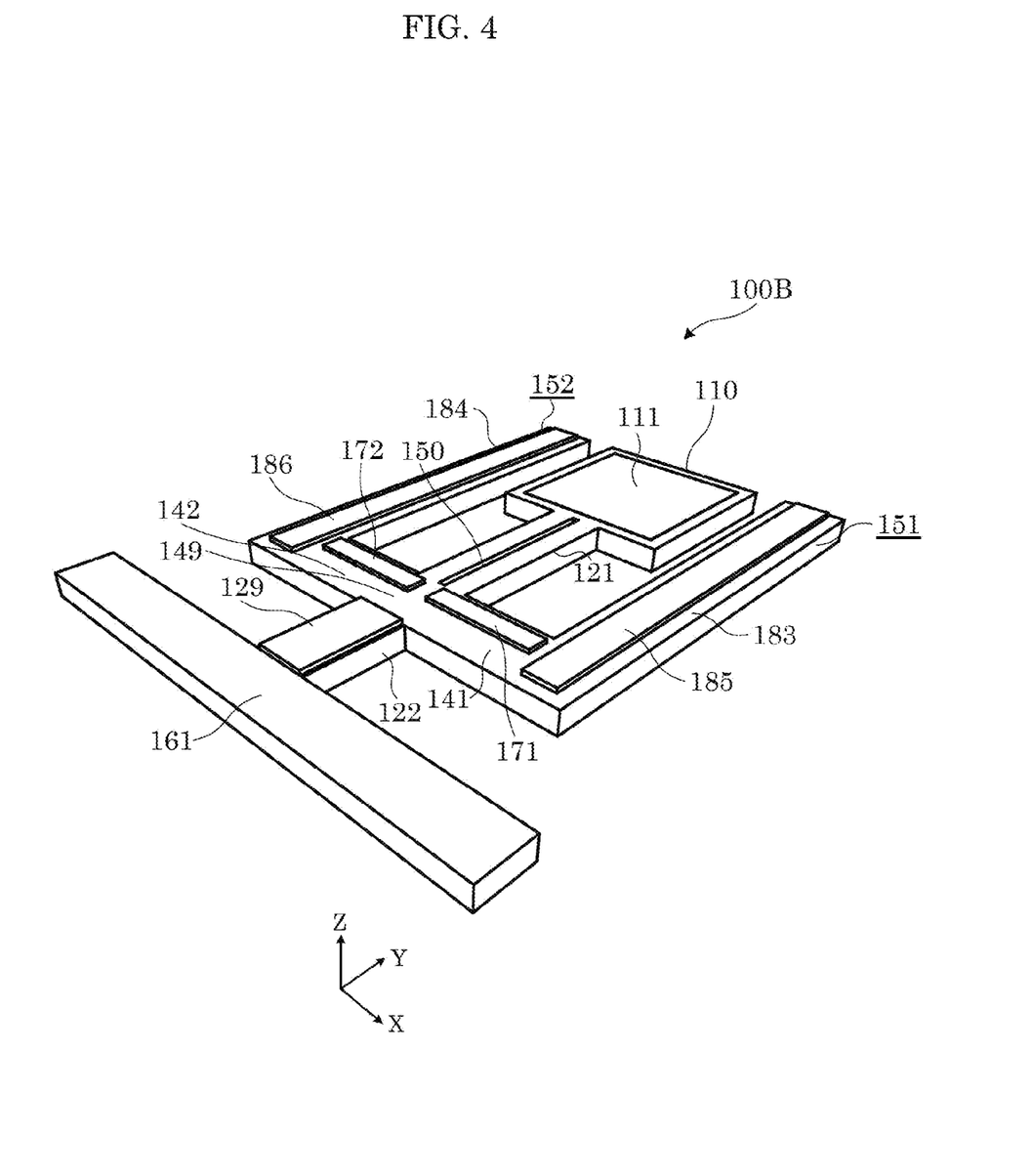
FIG. 4 is a perspective view illustrating an optical reflective element according to Variation 2.

The torsional rigidity per unit length of second connector body 122 may be higher than that of first connector body 121. The torsional rigidity per unit length of second connector body 122 may be enhanced by increasing the length (thickness) of second connector body 122 in the direction (the Z-axis direction in the diagram) orthogonal to the reflective surface (the X-Y plane in the diagram) of reflective body 110 as illustrated in FIG. 4.

The method of making the thickness of second connector body 122 greater than the thickness of first connector body 121 is not particularly limited. For example, reinforcing member 129 may be attached to the surface of second connector body 122 to increase the thickness of second connector body 122. In addition, the material of reinforcing member 129 is not particularly limited. For example, reinforcing member 129 may include the same material used for the piezoelectric element so that reinforcing member 129 and the piezoelectric element can be formed on second connector body 122 in the same process.

Conversely, first connector body 121 may be made thinner than second connector body 122. For example, first connector body 121 can be made thinner by etching only the surface of first connector body 121.

In addition, even in the case in which first connector body 121 and second connector body 122 have the same shape and the same area in cross sections orthogonal to first rotational axis 101, first connector body 121 and second connector body 122 may include mutually different materials to make the torsional rigidity per unit length of second connector body 122 higher than that of first connector body 121.

Furthermore, even if first connector body 121 and second connector body 122 include the same material, reformation of the material by heating, such as quenching and annealing, may also make the torsional rigidity per unit length of second connector body 122 higher than that of first connector body 121.

Figure 5:
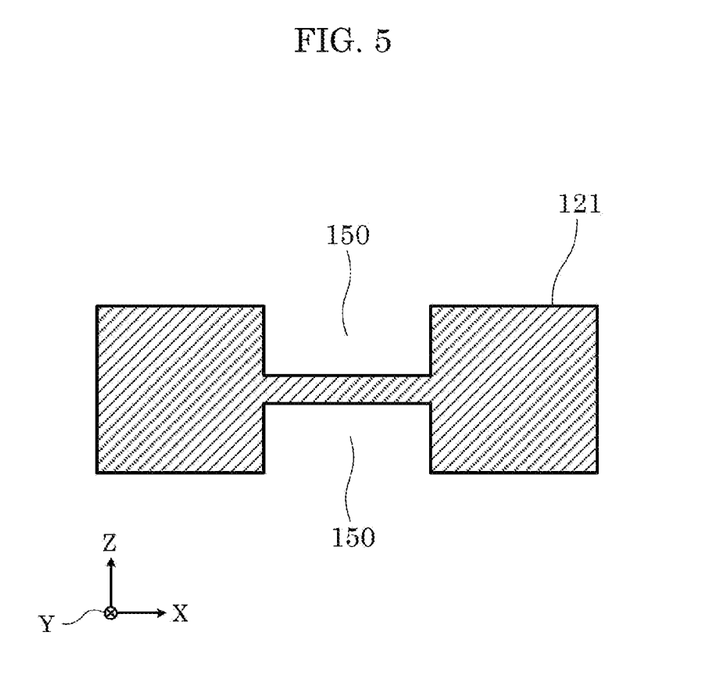
FIG. 5 is a sectional view illustrating a first connector body from a longitudinal direction.

In addition, groove portion 150 need not be in the shape of a slit that penetrates first connector body 121. Groove portion 150 may be a groove with a closed end as illustrated in FIG. 5. In this case, groove portions 150 may be provided, facing in opposite directions, in respective two surfaces of first connector body 121 for improving the symmetry of first connector body 121. It should be noted that although the cross section of each of the grooves in FIG. 5 is in the shape of a quadrilateral, the shape is not limited to a quadrilateral. In the cross-sectional view of a groove portion, the closed end of the groove portion may have a curved shape (U shape), a V shape, etc.

Figure 6:
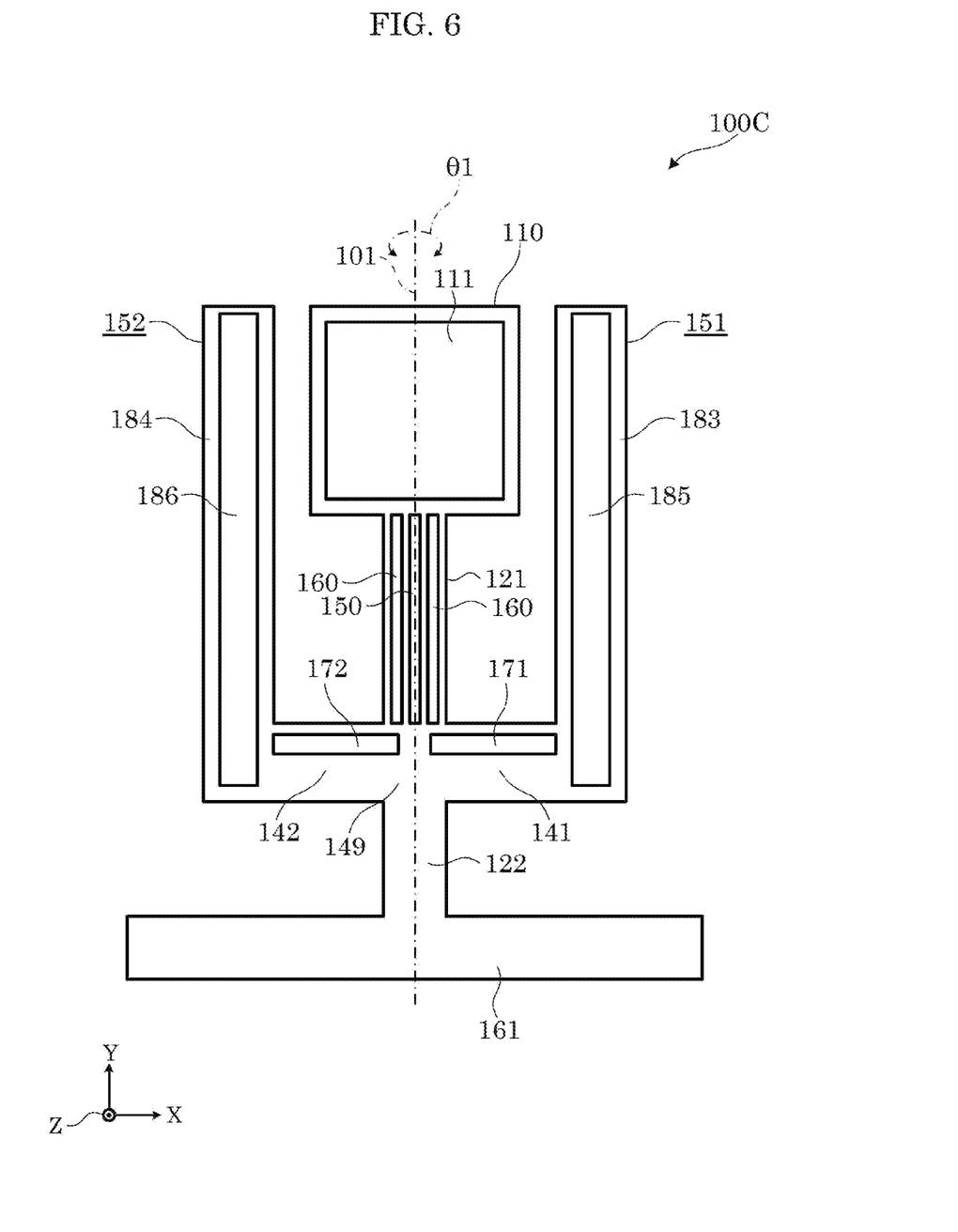
FIG. 6 is a plan view illustrating an optical reflective element according to Variation 3.

In addition, as illustrated in FIG. 6, lateral groove portion 160 may be provided on both sides of groove portion 150 such that lateral groove portions 160 are rotationally symmetric with respect to first rotational axis 101.

Embodiment 2

Next, a different embodiment of an optical reflective element will be described. It should be noted that elements (portions) having effects, functions, shapes, mechanisms, or structures identical to effects, functions, shapes, mechanisms, or structures of the elements (portions) described in Embodiment 1 may be given the same reference numerals, and descriptions of those elements may be omitted. In addition, the following mainly describes points different from Embodiment 1, and the redundant descriptions may be omitted.

Figure 7:
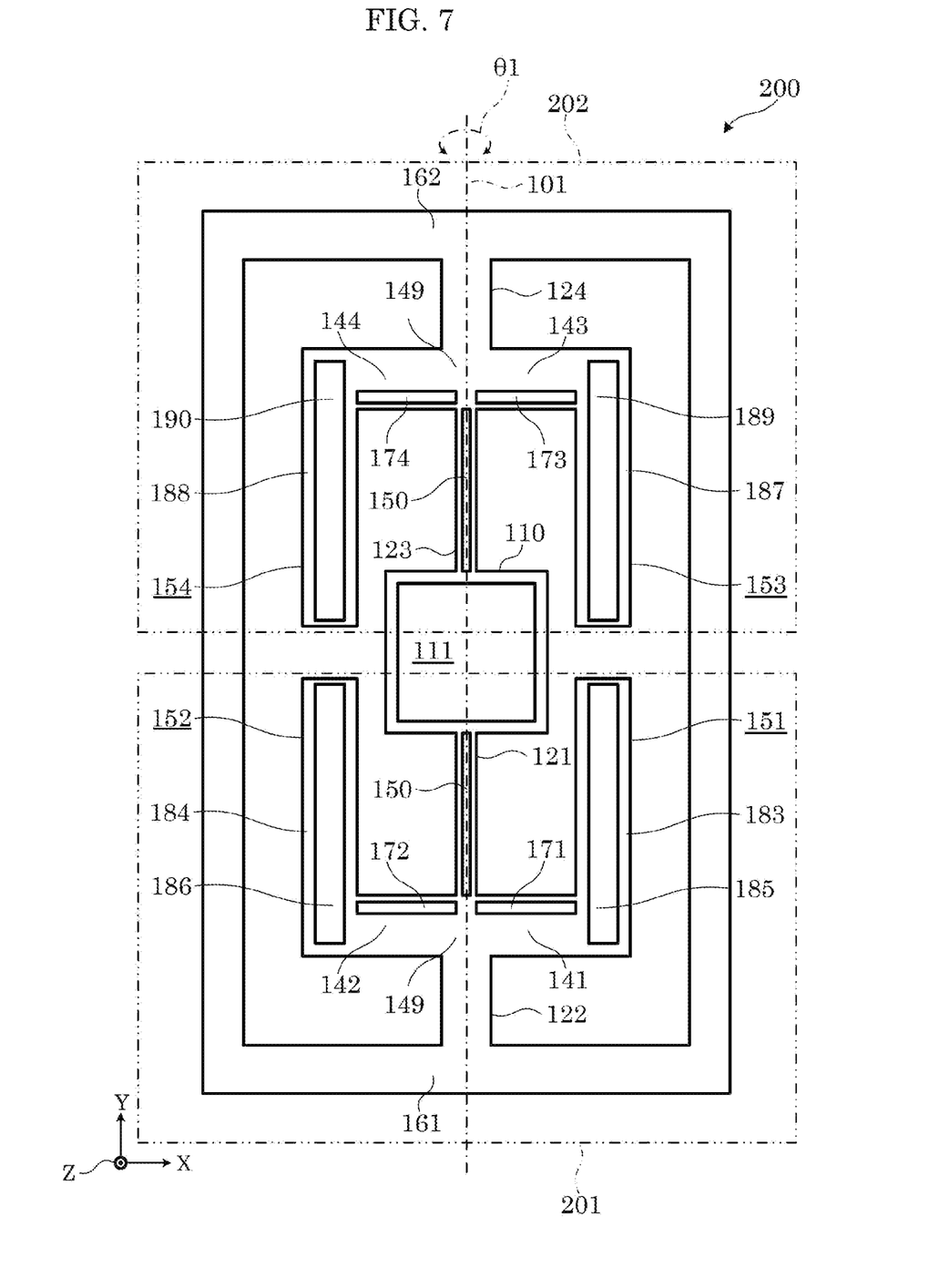
FIG. 7 is a plan view illustrating an optical reflective element according to Embodiment 2.

FIG. 7 is a plan view illustrating an optical reflective element according to Embodiment 2.

Optical reflective element 200 according to Embodiment 2 is a device that causes one reflective body 110 to rotationally oscillate by two rotational oscillation mechanisms that are symmetric across an imaginary plane which is orthogonal to first rotational axis 101 and in which the center of reflective body 110 is located. The rotational oscillation mechanisms include respective connector bodies, vibration bodies, driving bodies, bases, and monitor elements which are disposed symmetric across the imaginary plane. In addition, functions and connection modes of the connector bodies, the vibration bodies, the driving bodies, the bases, and the monitor elements included in the rotational oscillation mechanisms are the same as the functions and the connection modes described in Embodiment 1.

As specifically illustrated in FIG. 7, first rotational oscillation mechanism 201 includes, as connector bodies, first connector body 121 and second connector body 122, and second rotational oscillation mechanism 202 includes, as connector bodies, third connector body 123 and fourth connector body 124. First connector body 121 and second connector body 122, and third connector body 123 and fourth connector body 124 are disposed symmetric across the imaginary plane. Third connector body 123 is disposed opposite first connector body 121 with respect to reflective body 110 and along first rotational axis 101. Third connector body 123 has a distal end portion that is coupled to reflective body 110. Like first connector body 121, third connector body 123 is provided with groove portion 150. First rotational oscillation mechanism 201 includes, as vibration bodies, first vibration body 141 and second vibration body 142, and second rotational oscillation mechanism 202 includes, as vibration bodies, third vibration body 143 and fourth vibration body 144. First vibration body 141 and second vibration body 142, and third vibration body 143 and fourth vibration body 144 are disposed symmetric across the imaginary plane. First rotational oscillation mechanism 201 includes, as driving bodies, first driving body 151 and second driving body 152, and second rotational oscillation mechanism 202 includes, as driving bodies, third driving body 153 and fourth driving body 154. First driving body 151 and second driving body 152, and third driving body 153 and fourth driving body 154 are disposed symmetric across the imaginary plane. Like first rotational oscillation mechanism 201, third driving body 153 includes third driving body main portion 187 and third piezoelectric element 189, and fourth driving body 154 includes fourth driving body main portion 188 and fourth piezoelectric element 190. First rotational oscillation mechanism 201 includes, as a base, first base 161, and second rotational oscillation mechanism 202 includes, as a base, second base 162. First base 161 and second base 162 are disposed symmetric across the imaginary plane. In this embodiment, first base 161 and second base 162 are integrally coupled together, and form a quadrilateral frame member as a whole. In addition, like first rotational oscillation mechanism 201, second rotational oscillation mechanism 202 includes third vibration body 143 to which third monitor element 173 is attached, and fourth vibration body 144 to which fourth monitor element 174 is attached.

In addition to the advantageous effects described in Embodiment 1, optical reflective element 200 according to Embodiment 2 can steady reflective body 110 and can cause reflective body 110 to stably rotationally oscillate about first rotational axis 101, since torque for rotational oscillation is transmitted along first rotational axis 101 from both sides of reflective body 110.

Furthermore, since the ends of first base 161 and the ends of second base 162 are coupled together to form a frame shape, the structural strength of the entire optical reflective element 200 is enhanced, and thus first connector 121 and second connector 122 are less likely to be affected by a disturbance vibration. This enables reflective body 110 to stably rotationally oscillate.

Moreover, since a degree of the resonance sharpness (Q factor) of a structural body including reflective body 110, first connector body 121, second connector 122, third connector 123, and fourth connector 124 enhances, the driving frequency band of reflective body 110 narrows. Accordingly, optical reflective element 200 is less likely to be affected by a disturbance vibration. This enables reflective body 110 to stably rotationally oscillate. However, first base 161 and second base 162 need not be coupled together. In that case, optical reflective element 200 becomes smaller in the X-axis direction in the diagram, and thus gain advantages in downsizing and cost reduction.

Embodiment 3

Next, a different embodiment of an optical reflective element will be described. It should be noted that elements (portions) having effects, functions, shapes, mechanisms, or structures identical to effects, functions, shapes, mechanisms, or structures of the elements (portions) described in Embodiment 1 and Embodiment 2 may be given the same reference numerals, and descriptions of those elements may be omitted. In addition, the following mainly describes points different from Embodiment 1 and Embodiment 2, and the redundant descriptions may be omitted.

Figure 8:
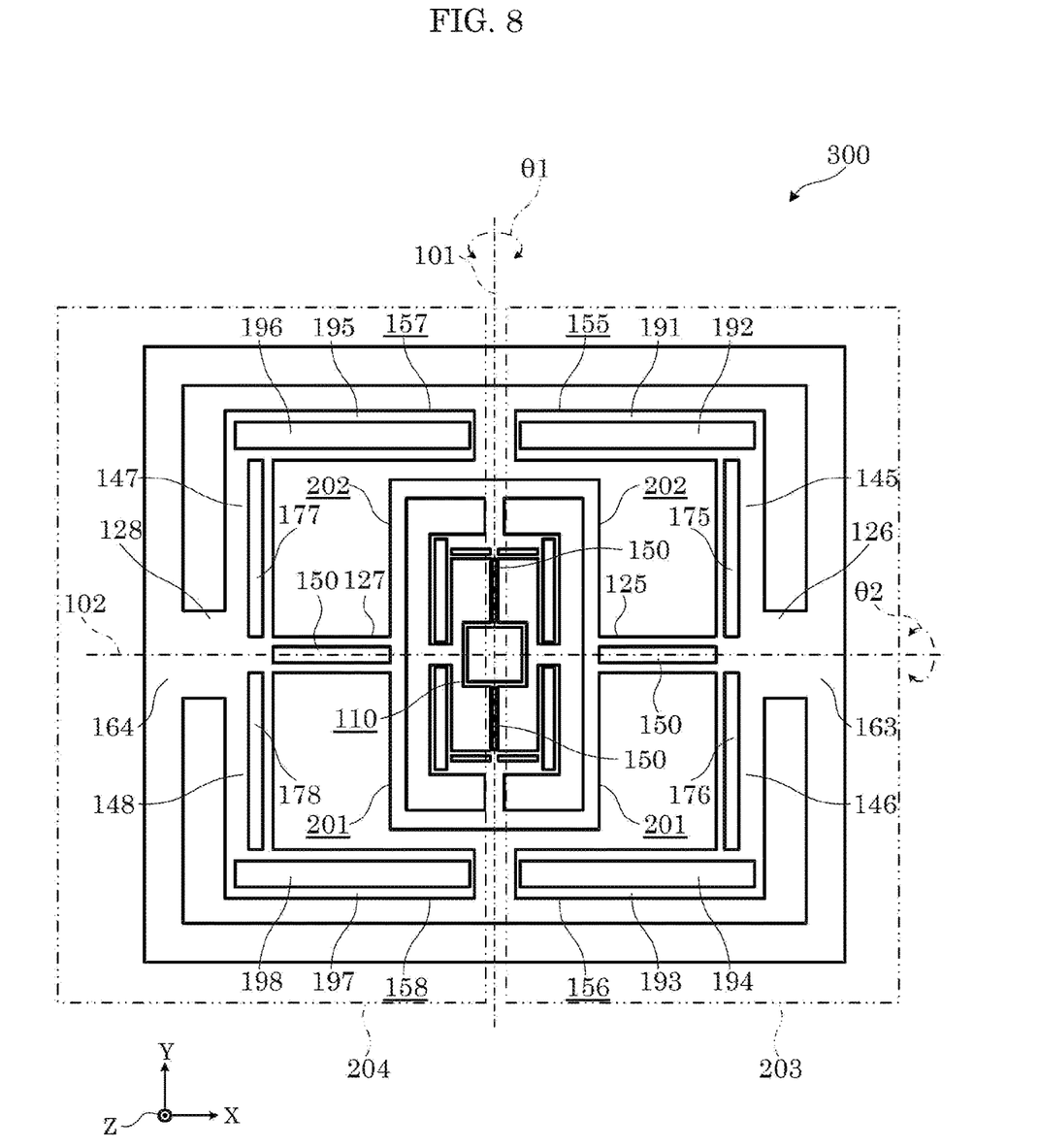
FIG. 8 is a plan view illustrating an optical reflective element according to Embodiment 3.

FIG. 8 is a plan view illustrating an optical reflective element according to Embodiment 3. It should be noted that indications of some of reference numerals of first rotational oscillation mechanism 201 and second rotational oscillation mechanism 202 are omitted.

Optical reflective element 300 according to Embodiment 3 further includes third rotational oscillation mechanism 203 and fourth rotational oscillation mechanism 204. Third rotational oscillation mechanism 203 and fourth rotational oscillation mechanism 204 are capable of causing reflective body 110, first rotational oscillation mechanism 201, and second rotational oscillation mechanism 202, which are described in Embodiment 2, to rotationally oscillate as a whole.

Third rotational oscillation mechanism 203 is a device that causes reflective body 110, first rotational oscillation mechanism 201, and second rotational oscillation mechanism 202 to integrally rotationally oscillate about second rotational axis 102. Second rotational axis 102 intersects with (in this embodiment, second rotational axis 102 is orthogonal to) first rotational axis 101 about which first rotational oscillation mechanism 201 and second rotational oscillation mechanism 202 cause reflective body 110 to rotationally oscillate. Like first rotational oscillation mechanism 201, third rotational oscillation mechanism 203 includes a connector body, a vibration body, a driving body, a base, and a monitor element. In addition, functions and connection modes of the connector body, the vibration body, the driving body, the base, and the monitor element are the same as the functions and the connection modes described in Embodiment 2.

As specifically illustrated in FIG. 8, third rotational oscillation mechanism 203 includes, as connector bodies, fifth connector body 125 and sixth connector body 126. Fifth connector body 125 is disposed along second rotational axis 102 that passes through reflective body 110, and has a distal end portion that is coupled to a frame member consisting of first base 161 and second base 162. Fifth connector body 125 includes groove portion 150 that is provided in a position in which second rotational axis 102 is located. Groove portion 150 that is provided in fifth connector body 125 is in the shape of a slit that penetrates fifth connector body 125 in the direction (the Z-axis direction in the diagram) orthogonal to a reflective surface of reflective body 110. In addition, groove portion 150 extends from a distal end portion of fifth connector body 125 which is connected to reflective body 110 to a proximal end portion of fifth connector body 125. Accordingly, fifth connector body 125 can be seen as two bar-shaped members with second rotational axis 102 interposed therebetween. Third rotational oscillation mechanism 203 includes, as vibration bodies, fifth vibration body 145 and sixth vibration body 146. Third rotational oscillation mechanism 203 includes, as driving bodies, fifth driving body 155 and sixth driving body 156. Fifth driving body 155 includes fifth driving body main portion 191 and fifth piezoelectric element 192, and sixth driving body 156 includes sixth driving body main portion 193 and sixth piezoelectric element 194. Third rotational oscillation mechanism 203 includes, as a base, third base 163. In this embodiment, third base 163 is a member for attaching optical reflective element 300 to an external structural member, and first base 161 is integrally attached to the distal end portion of fifth connector body 125 of third rotational oscillation mechanism 203. Like first rotational oscillation mechanism 201 etc., third rotational oscillation mechanism 203 includes fifth vibration body 145 to which fifth monitor element 175 is attached, and sixth vibration body 146 to which sixth monitor element 176 is attached.

Fourth rotational oscillation mechanism 204 and third rotational oscillation mechanism 203 are disposed symmetric across an imaginary plane which is orthogonal to second rotational axis 102 and in which the center of reflective body 110 is located. Rotational oscillation mechanism 204 and rotational oscillation mechanism 203 each include connector bodies, vibration bodies, driving bodies, bases, and monitor elements which are disposed symmetric across the imaginary plane.

Specifically, fourth rotational oscillation mechanism 204 includes, as connector bodies, seventh connector body 127 and eighth connector body 128. Seventh connector body 127 and eighth connector body 128, and fifth connector body 125 and sixth connector body 126 which third rotational oscillation mechanism 203 includes as connector bodies are disposed symmetric across the imaginary plane. Seventh connector body 127 is disposed opposite fifth connector body 125 with respect to reflective body 110 and along second rotational axis 102. Seventh connector body 127 has a distal end portion that is coupled to second base 162. Seventh connector body 127 includes groove portion 150 that is provided in a position in which second rotational axis 102 is located. Groove portion 150 that is provided in seventh connector body 127 is in the shape of a slit that penetrates seventh connector body 127 in the direction (the Z-axis direction in the diagram) orthogonal to the reflective surface of reflective body 110. In addition, groove portion 150 extends from a distal end portion of seventh connector body 127 which is connected to reflective body 110 to a proximal end portion of seventh connector body 127. Accordingly, seventh connector body 127 can be seen as two bar-shaped members with second rotational axis 102 interposed therebetween. Fourth rotational oscillation mechanism 204 includes, as vibration bodies, seventh vibration body 147 and eighth vibration body 148. Seventh vibration body 147 and eighth vibration body 148, and fifth vibration body 145 and sixth vibration body 146 which third rotational oscillation mechanism 203 includes as vibration bodies are disposed symmetric across the imaginary plane. Fourth rotational oscillation mechanism 204 includes, as driving bodies, seventh driving body 157 and eighth driving body 158. Seventh driving body 157 and eighth driving body 158, and fifth driving body 155 and sixth driving body 156 which third rotational oscillation mechanism 203 includes as driving bodies are disposed symmetric across the imaginary plane. Like third rotational oscillation mechanism 203, seventh driving body 157 includes seventh driving body main portion 195 and seventh piezoelectric element 196, and eighth driving body 158 includes eighth driving body main portion 197 and eighth piezoelectric element 198. Fourth rotational oscillation mechanism 204 includes, as a base, fourth base 164. Fourth base 164 and third base 163 which third rotational oscillation mechanism 203 includes as a base are disposed symmetric across the imaginary plane. In this embodiment, third base 163 and fourth base 164 are integrally coupled together, and form a quadrilateral frame member as a whole. In addition, fourth rotational oscillation mechanism 204 includes seventh vibration body 147 to which seventh monitor element 177 is attached, and eighth vibration body 148 to which eighth monitor element 178 is attached. Seventh vibration body 147, seventh monitor element 177, eighth vibration body 148, and eighth monitor element 178 which are included in fourth rotational oscillation mechanism 204, and fifth vibration body 145, fifth monitor element 175, sixth vibration body 146, and sixth monitor element 176 which are included in third rotational oscillation mechanism 203 are disposed symmetric across the imaginary plane.

In addition to the advantageous effects described in Embodiment 1 and Embodiment 2, optical reflective element 300 according to Embodiment 3 can further cause reflective body 110, which first rotational oscillation mechanism 201 and second rotational oscillation mechanism 202 cause to rotationally oscillate about first rotational axis 101, to rotationally oscillate about second rotational axis 102 that intersects with first rotational axis 101. Therefore, optical reflective element 300 according to Embodiment 3 can two-dimensionally sweep an illumination position of laser light, even if there is only a beam of laser light to be reflected.

In this embodiment, first rotational axis 101 and second rotational axis 102 are formed such that first rotational axis 101 and second rotational axis 102 are orthogonal to each other at the approximate center of reflective body 110. With this, the center of reflective body 110 serves as a fixed point. Accordingly, if light is incident on this fixed portion, an optical path of the light projected onto a screen is uniform, and if optical reflective element 300 is used for a projector etc., an image can be projected onto the screen with high accuracy.

Moreover, since a degree of the resonance sharpness (Q factor) of optical reflective element 300 that includes reflective body 110, first rotation oscillation mechanism 201, second rotation oscillation mechanism 202, third rotation oscillation mechanism 203, and fourth rotation oscillation mechanism 204 enhances, the driving frequency band of reflective body 110 narrows. Accordingly, optical reflective element 300 is less likely to be affected by a disturbance vibration. This enables reflective body 110 to stably rotationally oscillate.

Note that in above-described Embodiments 1 through 3, a pair of vibration bodies and a pair of driving bodies form, as a whole, a shape of a tuning fork. The pair of vibration bodies and the pair of driving bodies are disposed such that the pair of vibration bodies and the pair of driving bodies surround reflective body 110. This disposition not only downsizes an optical reflective element, but also allows the distal end portions of the vibration bodies and the distal end portions of driving bodies to be free ends. This enables an efficient increase in the oscillation angle of reflective body 110, thereby obtaining a large amount of vibrational energy from a small amount of energy. However, the present disclosure is not limited to the above-described Embodiments 1 through 3. For example, a vibration body and a driving body can form a bar shape.

For example, although first rotation oscillation mechanism 201 and second rotation oscillation mechanism 202 are disposed symmetric across an imaginary plane, and third rotation oscillation mechanism 203 and fourth rotation oscillation mechanism 204 are disposed symmetric across an imaginary plane, first rotation oscillation mechanism 201 and second rotation oscillation mechanism 202 may be disposed rotationally symmetric with respect to an axis, and third rotation oscillation mechanism 203 and fourth rotation oscillation mechanism 204 may be disposed rotationally symmetric with respect to an axis.

In addition, although a driving body main portion includes a piezoelectric element on one surface, the driving body main portion includes a piezoelectric element on both surfaces. Furthermore, a vibration body may include a piezoelectric element on its surface.

In addition, although groove portion 150 extends from a distal end portion of a connector body to a proximal end portion of the connector body, groove portion 150 may extends into a part of coupling body 149. In addition, the length of groove portion 150 may be shorter than the length of the connector body. Furthermore, a plurality of groove portions 150 may be provided in one connector body. In that case, each groove portion 150 may have a shorter length and a dot shape.

Figure 9:
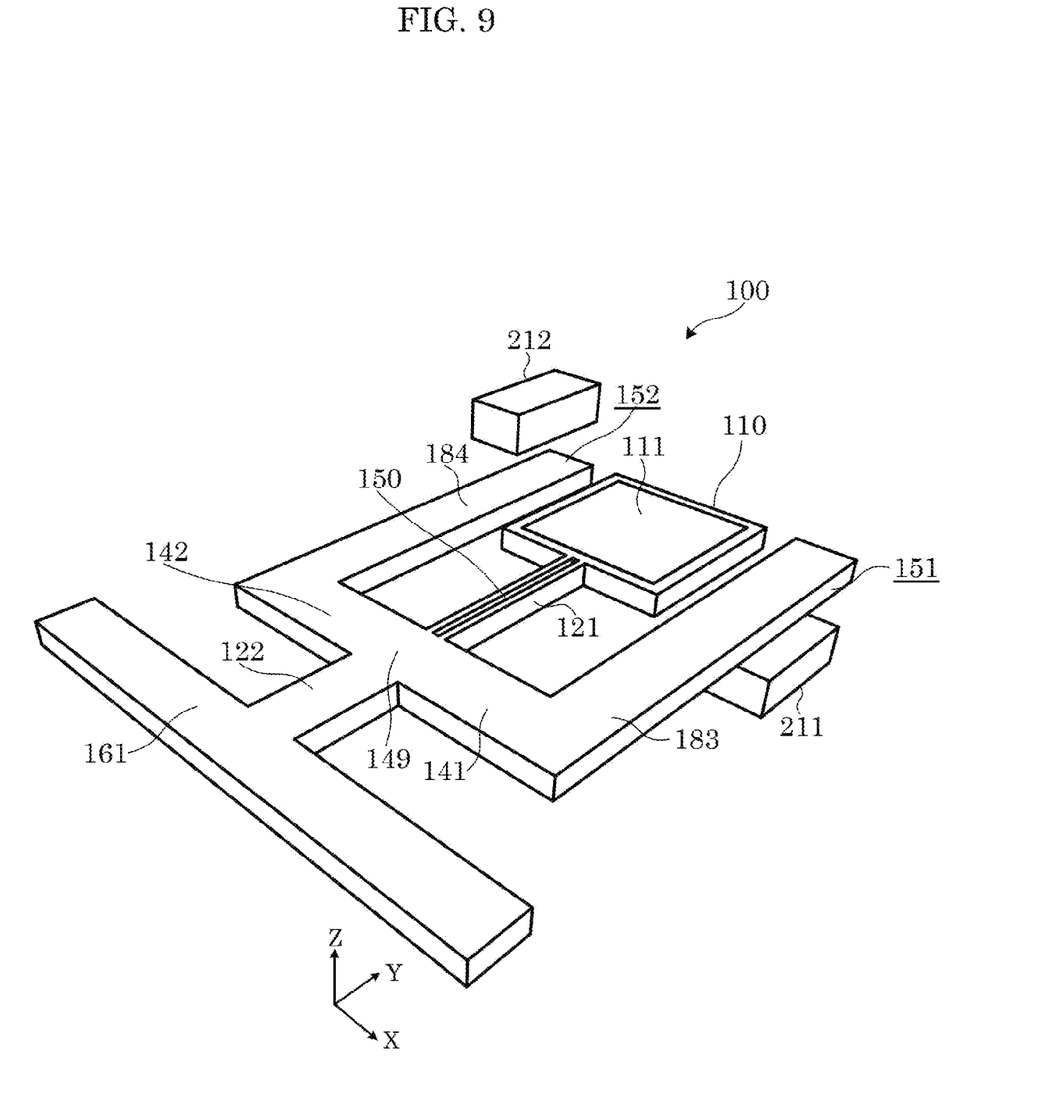
FIG. 9 is a perspective view illustrating an optical reflective element according to another variation.

It should be noted that although first driving body 183, second driving body 184, first vibration body 141, and second vibration body 142 include first piezoelectric element 185, second piezoelectric element 186, first monitor element 171, and second monitor element 172, respectively, in the above-described Embodiment 1, first piezoelectric element 185, second piezoelectric element 186, first monitor element 171, and second monitor element 172 need not be included as illustrated in FIG. 9. For example, in the case in which first driving body 183 and second driving body 184 are members that produce power by an interaction with an electrostatic force and an electromagnetic force which are externally supplied, first power generation device 211 and second power generation device 212 which generate an electrostatic force and an electromagnetic force may be provided outside an optical reflective element to vibrate first driving body 183 and second driving body 184 by either (i) changing at least one of a magnetic field and an electric field generated by the power generation devices, or (ii) changing at least one of a magnetic field and an electric field generated by first driving body 183 and second driving body 184. In addition, first power generation device 211 and second power generation device 212 may be one integrated device.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

Since the present disclosure has an advantageous effect of downsizing an optical reflective element according to the present disclosure, the optical reflective element is useful for a small display device, a small projector, an in-vehicle head-up display device, an electrographic copying machine, a laser-beam printer, an optical scanner, an optical radar, etc.

What is claimed is:
1. An optical reflective element, comprising:
 a reflective body that rotationally oscillates about a first rotational axis, and reflects light;
 a first connector body that is disposed along the first rotational axis, and includes a distal end portion coupled to the reflective body and a groove portion provided in a position in which the first rotational axis is located;
 a first vibration body that extends in a direction intersecting the first rotational axis, and is coupled to a proximal end portion of the first connector body;
 a second vibration body that extends in a direction intersecting the first rotational axis, and is coupled to the proximal end portion of the first connector body, the second vibration body being on a side opposite the first vibration body with respect to the first rotational axis;
 a first driving body that is coupled to a distal end portion of the first vibration body, and causes the first connector body to rotationally oscillate via the first vibration body;
 a second driving body that is coupled to a distal end portion of the second vibration body, and causes the first connector body to rotationally oscillate via the second vibration body;
 a first base;
 a second connector body that connects the first vibration body and the second vibration body to the first base in a manner that allows the first vibration body and the second vibration body to vibrate;
 a fifth connector body that is disposed along a second rotational axis extending in a direction intersecting the first rotational axis, and includes a distal end portion coupled to the first base and a groove portion provided in a position in which the second rotational axis is located;
 a fifth vibration body that extends in a direction intersecting the second rotational axis, and is coupled to a proximal end portion of the fifth connector body;

a sixth vibration body that extends in a direction intersecting the second rotational axis, and is coupled to the proximal end portion of the fifth connector body, the sixth vibration body being on a side opposite the fifth vibration body with respect to the second rotational axis;

a fifth driving body that is coupled to a distal end portion of the fifth vibration body, and causes the fifth connector body to rotationally oscillate via the fifth vibration body;

a sixth driving body that is coupled to a distal end portion of the sixth vibration body, and causes the fifth connector body to rotationally oscillate via the sixth vibration body; and a sixth connector body that connects the fifth vibration body and the sixth vibration body to a third base in a manner that allows the fifth vibration body and the sixth vibration body to vibrate.

2. The optical reflective element according to claim 1, comprising:

a third connector body that is disposed along the first rotational axis, and includes a distal end portion coupled to the reflective body and a groove portion provided in a position in which the first rotational axis is located, the third connector body being on a side opposite the first connector body with respect to the reflective body;

a third vibration body that extends in a direction intersecting the first rotational axis, and is coupled to a proximal end portion of the third connector body;

a fourth vibration body that extends in a direction intersecting the first rotational axis, and is coupled to the proximal end portion of the third connector body, the fourth vibration body being on a side opposite the third vibration body with respect to the first rotational axis;

a third driving body that is coupled to a distal end portion of the third vibration body, and causes the third connector body to rotate by vibration via the third vibration body;

a fourth driving body that is coupled to a distal end portion of the fourth vibration body, and causes the third connector body to rotate by vibration via the fourth vibration body; and a fourth connector body that connects the third vibration body and the fourth vibration body to a second base in a manner that allows the third vibration body and the fourth vibration body to vibrate.

3. The optical reflective element according to claim 2, comprising:

a fifth connector body that is disposed along the second rotational axis, and includes a distal end portion coupled to the first base and a groove portion provided in a position in which the second rotational axis is located;

a fifth vibration body that extends in a direction intersecting the second rotational axis, and is coupled to a proximal end portion of the fifth connector body;

a sixth vibration body that extends in a direction intersecting the second rotational axis, and is coupled to the proximal end portion of the fifth connector body, the sixth vibration body being on a side opposite the fifth vibration body with respect to the second rotational axis;

a fifth driving body that is coupled to a distal end portion of the fifth vibration body, and causes the fifth connector body to rotationally oscillate via the fifth vibration body;

a sixth driving body that is coupled to a distal end portion of the sixth vibration body, and causes the fifth connector body to rotationally oscillate via the sixth vibration body; and a sixth connector body that connects the fifth vibration body and the sixth vibration body to a fourth base in a manner that allows the fifth vibration body and the sixth vibration body to vibrate.

4. The optical reflective element according to claim 1, wherein
the groove portion is in a shape of a slit that penetrates the first connector body in a direction orthogonal to a reflective surface of the reflective body.

5. The optical reflective element according to claim 1, wherein
the groove portion extends from the distal end portion of the first connector body to the proximal end portion of the first connector body, the distal end portion being connected to the reflective body.

6. The optical reflective element according to claim 1, wherein
the groove portion extends from the distal end portion of the first connector body to the proximal end portion of the first connector body, the distal end portion being connected to the reflective body.

7. The optical reflective element according to claim 1, wherein
a lateral groove portion is provided on both sides of the groove portion.

* * * * *